(12) United States Patent
Kitajima et al.

(10) Patent No.: US 6,428,911 B2
(45) Date of Patent: Aug. 6, 2002

(54) SOLDERING METHOD AND SOLDERED JOINT

(75) Inventors: Masayuki Kitajima; Masakazu Takesue; Tadaaki Shono; Motoko Fujioka, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/930,245

(22) Filed: Aug. 16, 2001

Related U.S. Application Data

(63) Continuation of application No. PCT/JP00/06389, filed on Sep. 19, 2000.

(30) Foreign Application Priority Data

Apr. 17, 2000 (JP) .................................. PCT/JP00/02491

(51) Int. Cl.[7] .......................... B23K 1/20; B23K 31/02; B05D 1/36; B05D 5/12; B22B 15/00
(52) U.S. Cl. .................. 428/674; 427/58; 427/125; 427/282; 427/383.1; 427/383.7; 427/404; 427/405; 228/208; 228/209
(58) Field of Search .................. 427/125, 58, 404, 427/405, 282, 383.1, 383.7; 228/203, 208, 209, 211; 428/674

(56) References Cited

U.S. PATENT DOCUMENTS

| | | | | |
|---|---|---|---|---|
| 4,695,428 A | * | 9/1987 | Ballentine et al. ............ 420/561 |
| 4,778,733 A | * | 10/1988 | Lubrano et al. ............. 428/647 |
| 4,879,096 A | * | 11/1989 | Naton ........................ 420/561 |
| 5,713,997 A | * | 2/1998 | Kuramoto et al. ...... 106/287.18 |
| 5,837,191 A | * | 11/1998 | Gickler ....................... 420/560 |
| 5,982,629 A | * | 11/1999 | Shoji et al. ................. 361/760 |

FOREIGN PATENT DOCUMENTS

| | | |
|---|---|---|
| JP | 8-215880 | 8/1996 |
| JP | 8-330105 A | * 12/1996 |
| JP | 9-27498 A | * 1/1997 |
| JP | 9-155586 | 6/1997 |
| JP | 2000-8185 | 1/2000 |

* cited by examiner

Primary Examiner—Michael Barr
(74) Attorney, Agent, or Firm—Armstrong, Westerman & Hattori, LLP

(57) ABSTRACT

The present invention provides a soldering method and a soldered joint securing a strength of joint equivalent to soldering using a conventional Pb—Sn solder alloy without having a detrimental effect on the environment and without causing a rise in cost. A soldering method comprising a step of covering Cu electrodes of electronic equipment by a rust-proofing coating consisting of an organic compound including N and a step of forming soldered joints on the covered Cu electrodes, by using a solder material consisting of at least 2.0 wt % and less than 3 wt % of Ag, 0.5 to 0.8 wt % of Cu, and a balance of Sn and unavoidable impurities. The solder material used in the present invention further contains not more than 3 wt % in total of at least one element selected from the group consisting of Sb, In, Au, Zn, Bi, and Al.

9 Claims, 9 Drawing Sheets

IMIDAZOLE

BENZOIMIDAZOLE
(BIA)

ALKYLBENZOIMIDAZOLE

BENZOTRIAZOLE
(BTA)

MERCAPTOBENZOTHIAZOLE
(MBT)

PYRROLE

THIAZOLE

SOLDERING METHOD AND SOLDERED JOINT

CROSS-REFERENCE TO RELATED APPLICATIONS

This application is based upon and claims priority of International Application PCT/JP00/02491, filed on Apr. 17, 2000, the contents being incorporated herein by reference, and a continuation of PCT/JP00/06389 filed Sep. 19, 2000.

TECHNICAL FIELD

The present invention relates to a method of soldering electronic equipment by a lead-free solder material and a soldered joint formed by the same.

BACKGROUND ART

Up until now, broad use has been made of lead-tin (Pb—Sn) solder alloys for soldering various types of electrical and electronic equipment from the viewpoint of their low melting points and good wettability even in oxidizing atmospheres.

Pb has toxicity, so various restrictions are placed on the handling of Pb and alloys and other materials containing Pb.

Further, the recent growing interest in protecting the environment has been accompanied by tougher regulations on disposal of electronic equipment and other waste using Pb-containing alloys.

In the past, scrap electronic equipment using large amounts of Pb-containing solder alloy was generally mainly disposed by burial in the same way as ordinary industrial waste or general waste.

If scrap electronic equipment using large amounts of Pb-containing solder continues to be disposed of by burial as at the present, the elution of the Pb is liable to have a detrimental effect on the environment and living organisms.

In the near future, disposal of scrap electronic equipment using large amounts of Pb-containing solder alloy only after reclamation of the Pb will probably become mandatory.

Up until now, however, no technique has been established for removing Pb efficiently and effectively from scrap electronic equipment etc. Further, the cost of reclamation of Pb is liable to cause a rise in the cost of the products.

Therefore, there is strong interest in development of a soldering technique using a lead-free solder material.

Some lead-free solder materials have been commercialized such as alloys of Sn with Sb (antimony), Ag (silver), Ge (germanium), Ti (titanium), etc. added complexly, but these are limited to special applications. This is because they do not have the features required in general applications in which used conventional Pb—Sn solder alloys have been used, that is, the low melting point and good wettability, reflowability, and the freedom from reaction with the base material to form a brittle compound layer or embrittled layer.

Disclosure of the Invention

The present invention has as its object the provision of a soldering method and soldered joint able to ensure a strength of joint comparable to that of soldering using a conventional Pb—Sn solder alloy without having a detrimental effect on the environment and without a rise in the cost.

The object can be achieved by the a soldering method characterized by comprising the following steps of:

covering Cu electrodes of electronic equipment by a rust-proofing coating consisting of an organic compound including N and forming soldered joints on the covered Cu electrodes, by using a solder material consisting of at least 2.0 wt % to less than 3 wt % of Ag, 0.5 to 0.8 wt % of Cu, and a balance of Sn and unavoidable impurities.

The solder material used in the present invention may further contain not more than 3 wt % in total of at least one element selected from the group consisting of Sb, In, Au, Zn, Bi, and Al.

One of the typical applications of the present invention is a printed circuit board of an electronic device. By covering the Cu electrodes to be soldered by a rust-proofing coating comprised of an organic compound including N (nitrogen), long term storability and solder wettability are ensured.

In the past, the practice had been to nickel plate the Cu electrodes, then gold plate them, but this had the defect of a high cost and further a complicated plating process and therefore a long manufacturing time. Further, there was the danger of environmental pollution by the disposal of the waste liquor of the plating.

In the present invention, by the use of the above rust-proofing coating, the cost is reduced and the production time is shortened.

In the past, for rust-proofing the Cu electrodes, a resin coating of rosin (natural pine resin), resin (synthetic resin), etc. had been formed. Since the coating was a thick one of over 20 μm, however, probing during electrical tests became difficult. Due to this and other reasons, cleaning was necessary after the soldering.

On the other hand, the practice has been to use a water-soluble rust-proofing agent to reduce the thickness of the coating so as to eliminate the cleaning after the soldering. That is, the Cu electrodes have been cleaned by etching by a copper sulfate solution etc., then immersed in a solution containing 1000 to 5000 ppm of a water-soluble rust-proofing agent to form a coordinate bond coating.

In the present invention, an extremely thin rust-proofing coating is formed by coordinate bonds (chelate bonds) by the N in the organic compound containing N and the metal. The thickness of the coating is believed to be less than 3000 Å.

As the N-containing organic compound comprising the rust-proofing coating of the present invention, use is made of cyclic compounds of the structural formulas shown in FIG. 1 such as imidazole, benzoimidazole, alkylimidazole, benzotriazole, mercaptobenzothiazole, pyrrole, thiazole, etc.

The characteristics required as a solder material are as follows:

(1) A high wettability with the base material.
(2) The ability of soldering at a sufficiently low temperature so as not to cause heat damage to the electronic equipment being soldered. That is, a melting point equal to the melting point of conventional Pb—Sn solder of 456 K (183° C.).
(3) Freedom from reaction with the base material to form a brittle intermetallic compound or embrittled layer.
(4) The ability to be supplied in a form enabling application to automation such as a paste, powder, or thread solder.
(5) Freedom from poor wettability, voids, bridges, and other defects due to oxides of the metal ingredients in the solder material.

In particular, in soldering electrical equipment, the molten solder has to be made to flow into narrow clearances, so the surface tension, viscosity, fluidity, etc. of the solder material are important.

The conventional Pb—Sn solder alloys satisfy the above conditions well, but it has been difficult to avoid environmental pollution due to Pb.

The solder material used in the present invention is an Ag—Cu—Sn alloy consisting of at least 2.0 wt % and less than 3.0 wt % of Ag, 0.5 to 0.8 wt % of Cu, and the balance of substantially Sn. Since it does not contain Pb and since the alloy ingredients Ag, Cu, and Sn are all elements with a high safety, there is no fear of environmental pollution. Further, the above required characteristics are sufficiently satisfied.

The reasons for limiting the composition of the Ag—Cu—Sn solder alloy of the present invention are explained below.

[Ag: at least 2.0 wt % and less than 3.0 wt %]

Regarding the most basic characteristic of a solder material, its melting point, it is necessary to secure a low melting point (not more than 220° C.) equal to that of the conventional Pb—Sn solder alloys. If the Ag content is at least 2.0 wt %, a low melting point of not more than 220° C. can be secured. If the Ag content becomes less than 2.0 wt %, the melting point suddenly rises. On the other hand, if the Ag content becomes 3.0 wt % or more, a large amount of needle crystals are produced, the electronic devices short-circuit with each other, and the reliability of the joint falls. For applications where it is particularly necessary to prevent short-circuits due to needle crystals and watch the reliability of the joint, it is preferable to further limit the Ag content in the range of the present invention to not more than 2.5 wt % since the production of needle crystals can be substantially completely prevented. Conversely, for applications where it is necessary to particularly keep down the thickness of the intermetallic compound layer explained later, it is preferable to further limit the Ag content within the range of the present invention to not less than 2.5 wt % since the thickness of the intermetallic compound layer can be further reduced. As the Ag content for simultaneously satisfying both these conditions, 2.5 wt % is most preferable.

[Cu: 0.5 to 0.8 wt %]

The solder alloy and Cu electrodes are joined by the production of an intermetallic compound at the interface between the solder alloy and the Cu electrodes. That is, the production of an intermetallic compound is essential. On the other hand, if the intermetallic compound layer becomes too thick, it becomes brittle and the strength of joint falls. Therefore, the intermetallic compound layer is preferably formed as thin as possible at the time of joining. It is preferable that it be resistant to growth due to the heat history after joining. The inventors measured the thickness of the intermetallic compound layer at the joint interface at temperatures of up to 150° C., believed to be the heat history to which electronic equipment is subjected in the usage environment. As a result, they discovered that when the Ag content is in the range of the present invention and the Cu content is in the range of 0.5 to 0.8 wt %, the thickness of the intermetallic compound layer stabilizes and can be suppressed to not more than about 4 μm. Even if the Cu content is only a little over the above range, the thickness of the intermetallic compound layer increases. As a Cu content able to suppress the thickness of the intermetallic compound layer to the thinnest, 0.7 wt % is most preferable.

Due to the above reasons, in the Ag—Cu—Sn solder alloy of the present invention, the Ag content is limited to at least 2.0 wt % and less than 3.0 wt % and the Cu content is limited to 0.5 to 0.8 wt %. The Ag content may in accordance with need be selected to be in either the range of at least 2.0 wt % to not more than 2.5 wt % or at least 2.5 wt % to less than 3.0 wt %. The most preferable composition is 2.5 Ag-0.7 C—Sn.

In general, if the soldering temperature of electronic equipment falls by 10 K (10° C.), the lifetime of electronic devices is said double. Reduction of the melting point of the solder material is extremely important.

Further, the Ag—Cu—Sn solder alloy of the present invention has properties extremely close to the main ingredient Sn, is good in wettability with Cu, and has a high conductivity.

Further, since the amount of Ag added is small, the alloy is provided inexpensively at the same level as a conventional Pb—Sn alloy.

The solder alloy of the present invention can include a total of not more than 3 wt % of one or more elements selected from Sb (antimony), In (indium), Au (gold), Zn (zinc), Bi (bismuth), and Al (aluminum) in addition to the above basic composition of Ag—Cu—Sn.

These elements (in particular In and Bi) further lower the melting point of the solder alloy and further improve the wettability. If the total amount is over 3 wt %, however, the appearance of the soldered joint, in particular the luster, is degraded. Further, if the content of Bi alone is over 3 wt %, the reliability of the joint with a Pb-containing material falls.

The solder alloy of the present invention contains as unavoidable impurities O (oxygen), N, H (hydrogen), etc. In particular, O is liable to make the alloy brittle, so preferably should be kept very small in amount.

A solder alloy comprised mainly of Sn is susceptible to oxidation of the Sn at the time of soldering. Therefore, the soldering is preferably performed in an $N_2$ or Ar (argon) or other nonoxidizing atmosphere. Due to this, it is possible to prevent poor wetting or poor electrical connection due to oxidation of the solder alloy.

The soldering of the present invention, like the conventional soldering, can be performed while applying an ultrasonic wave so as to promote wetting.

BEST MODE FOR WORKING THE INVENTION

EXAMPLE 1

The reasons for limitation of the range of Ag content in the present invention will be explained in future detail by this example.

Figure 1:
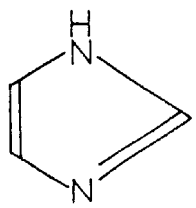
FIG. 1 is a chemical structural formula showing a specific example of a rust-proofing coating comprised of an organic compound containing N used in the present invention.
Figure 1:
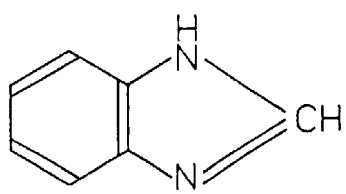
Figure 1:
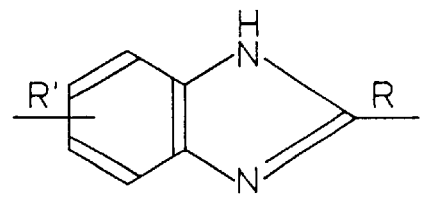
Figure 1:
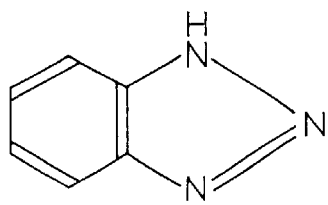
Figure 1:
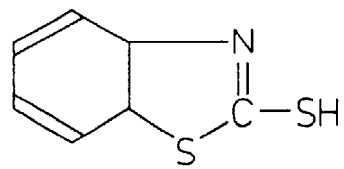
Figure 1:
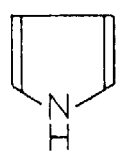
Figure 1:
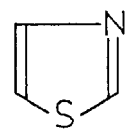
Figure 2:
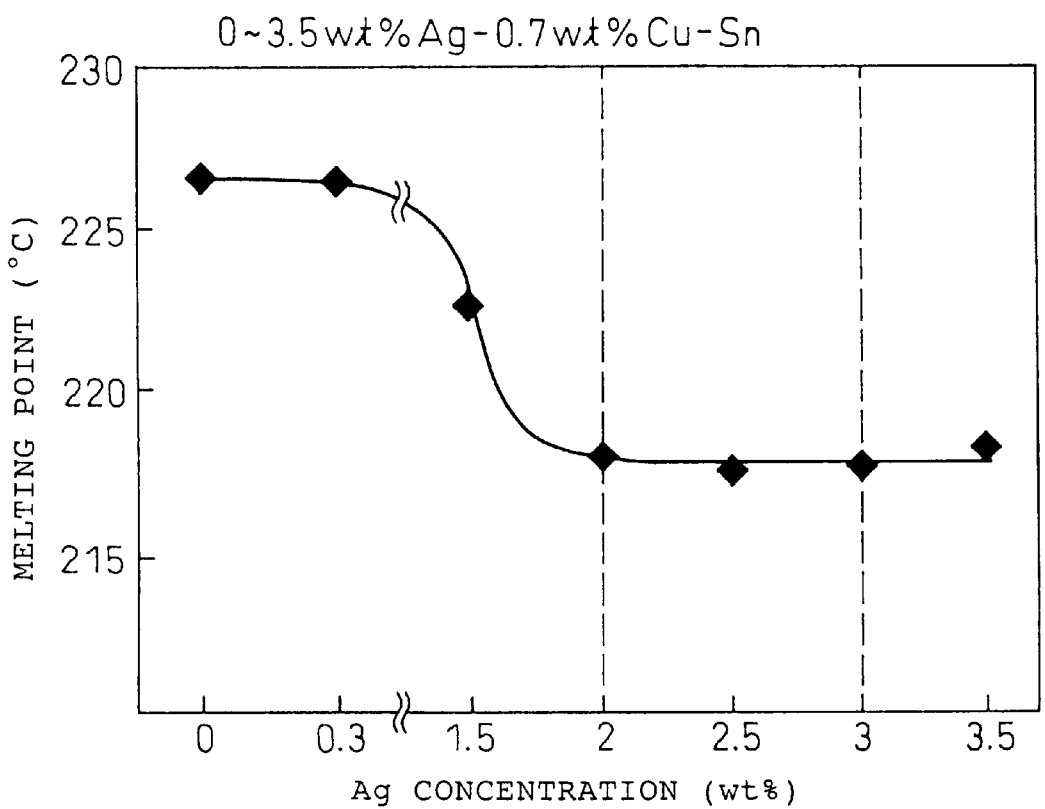
FIG. 2 is a graph of the change in melting point of an alloy with respect to Ag content for a 0 to 3.5 wt % Ag-0.7 wt % Cu—Sn solder alloy.

The effect of the Ag content and the Cu content on the melting point of an Ag—Cu—Sn alloy was investigated. Specifically, the melting point of a 0 to 3.5 wt % Ag-0 to 3 wt % Cu—Sn solder alloy was measured. FIG. 2 and Table 1 show the change in melting point of an alloy with respect to the Ag content for a 0 to 3.5 wt % Ag-0.7 wt % Cu—Sn solder alloy. As shown in FIG. 2 and Table 1, a low melting point of not more than 220° C. is obtained by a lower limit of the Ag content defined in the present invention of not less than 2.0. If the Ag content becomes less than 2.0 wt %, the melting point sharply rises. This relation between the Ag content and melting point is the same for the range of Cu content defined in the present invention of 0.5 to 0.8 wt %. Note that the Pb—Sn in Table 1 is a conventional 37 wt % Pb—Sn solder alloy.

Figure 3:
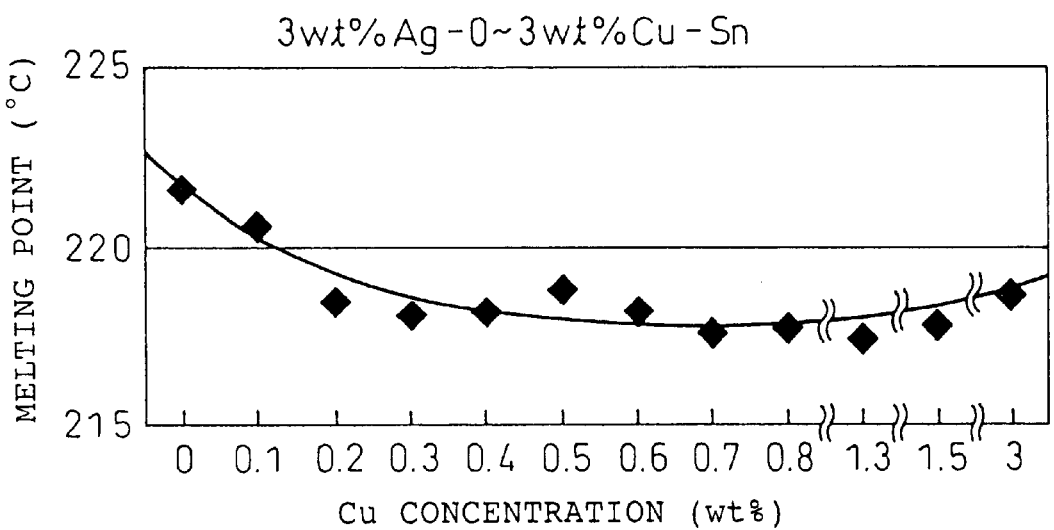
FIG. 3 is a graph of the change in melting point of an alloy with respect to Cu content for a 3 wt % Ag-0 to 3 wt % Cu—Sn solder alloy.

FIG. 3 and Table 2 show the change in melting point of an alloy with respect to the Cu content for a 3 wt % Ag-0 to 3 wt % Cu—Sn solder alloy. It is learned that at a Cu content of a broad range including the range of Cu of 0.5 to 0.8 wt % of the present invention, a low melting point of not more than 220° C. is obtained. Similar results were obtained for the relation between the Cu content and melting for an Ag content of a range of not less than 2.0 wt % and less than 3.0 wt %.

Next, the strength of joint was investigated for a 0 to 3.5 wt % Ag-0.7 wt % Cu—Sn alloy and a 3Ag-0.5 to 1.3 wt % Cu—Sn alloy. The joining procedure was similar to that of Example 2. As shown in Table 3 and Table 4, the solder alloy of the range of composition of the present invention gives a strength of joint higher than that of a conventional Pb—Sn solder alloy.

Figure 4:
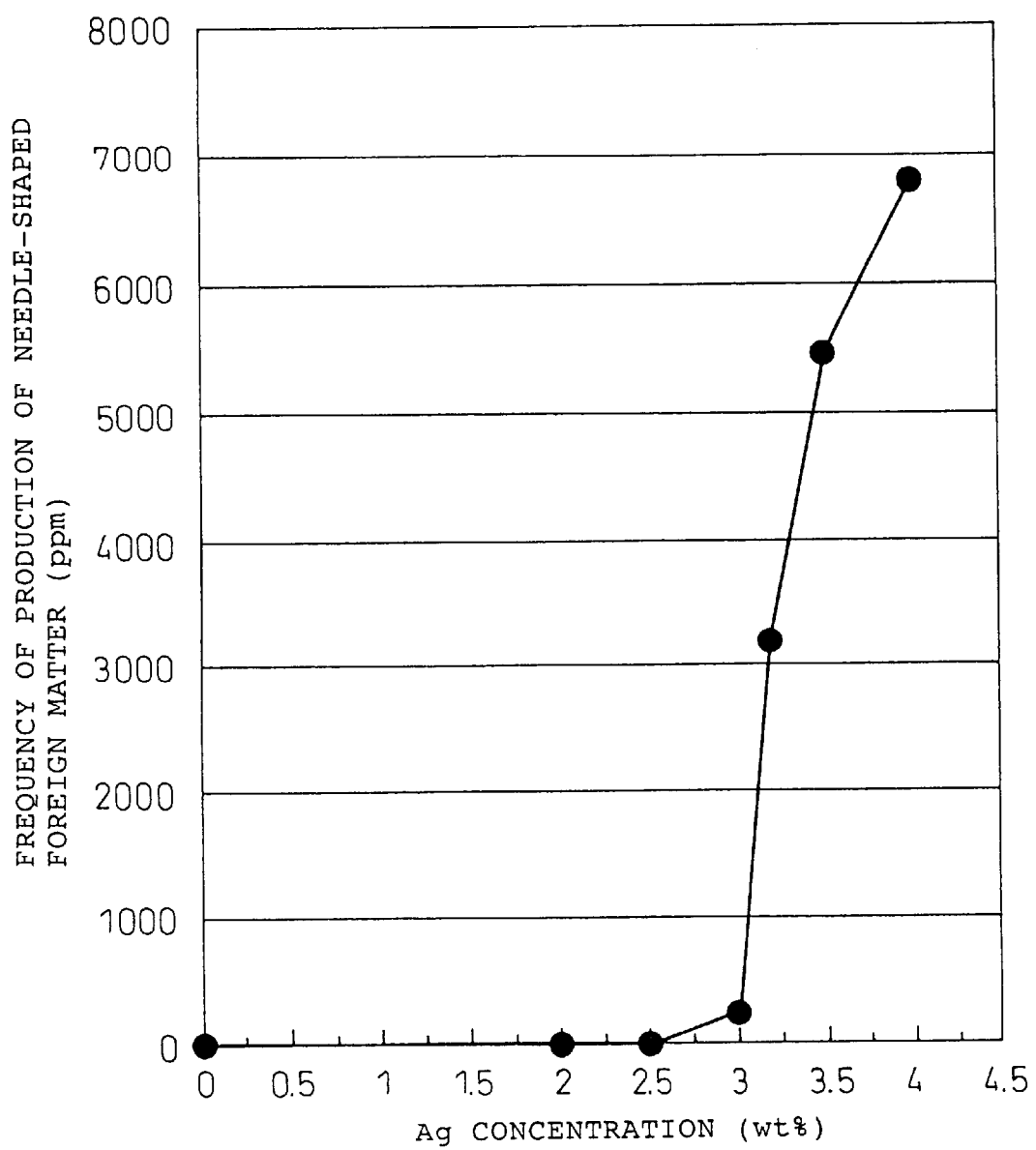
FIG. 4 is a graph of the relationship between the Ag content in a 0 to 4 wt % Ag-0.7 wt % Cu—Sn solder alloy and the frequency of occurrence of needle-shaped foreign matter.

Further, the frequency of occurrence of needle crystals having an effect on the strength of joint was investigated. FIG. 4 shows the relation between the Ag content and the frequency of occurrence of needle crystals (needle-shaped foreign matter) for a 0 to 4 wt % Ag-0.7 wt % Cu—Sn solder alloy. As shown in FIG. 4, when the Ag content becomes not less than 3.0 wt %, a large amount of needle crystals are produced. If a large amount of needle crystals occur in this way, the electronic devices will short-circuit between them and the reliability of the joint will fall. For applications where it is necessary to particularly prevent short-circuits by needle crystals and the watch the reliability of joint, if the Ag content is limited to not more than 2.5 wt %, as shown in FIG. 4, the occurrence of needle crystals can be substantially completely prevented, so this is further desirable. Note that while the figure shows the results of measurement for a 0 to 4 wt % Ag-0.7 wt % Cu—Sn solder alloy, similar results are obtained for a range of Cu content of 0.5 to 0.8 wt % defined in the present invention.

EXAMPLE 2

The reasons for limitation of the range of Cu content in the present invention will be explained in future detail by this example.

Solder alloys having compositions of Sn-2.0 to 3.0 Ag-0 to 1.5Cu were prepared.

A rust-proofing coating of an alkylbenzotriazole compound was formed as an N-containing organic compound on Cu electrodes of printed circuit boards comprised of copper-clad laminate boards.

Soldered joints were formed by the following procedure on the Cu electrodes provided with the coatings by the solder alloys.

1) 90 wt % of a solder powder produced from each alloy (particle size of about 20 to 42 μm) and 10 wt % of a flux (activating agent and resin component) were mixed to prepare a solder paste. The solder paste was screen printed on the Cu electrodes provided with the above coating to form a solder paste layer of a uniform thickness (about 150 μm).

2) The connection terminals of the electronic device were placed on the Cu electrodes provided with the solder paste layers. The connection terminals were comprised of 42 Alloy (Fe-42 wt % Ni alloy).

3) The solder paste layers were heated to at least 498 K (225° C.) to melt the solder, then the heating was stopped and the layers were allowed to cool to room temperature. Due to this, soldered joints for joining the Cu electrodes and 42 Alloy connection terminals were formed.

Figure 5:
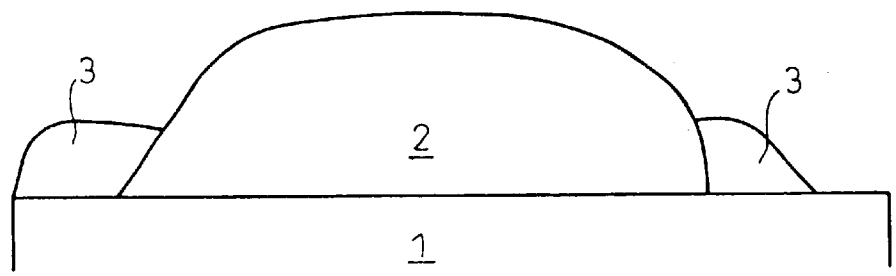
FIG. 5 is a sectional view schematically showing a rust-proofing coating/flux mixture expelled from the soldered joint of the present invention.
Figure 6:
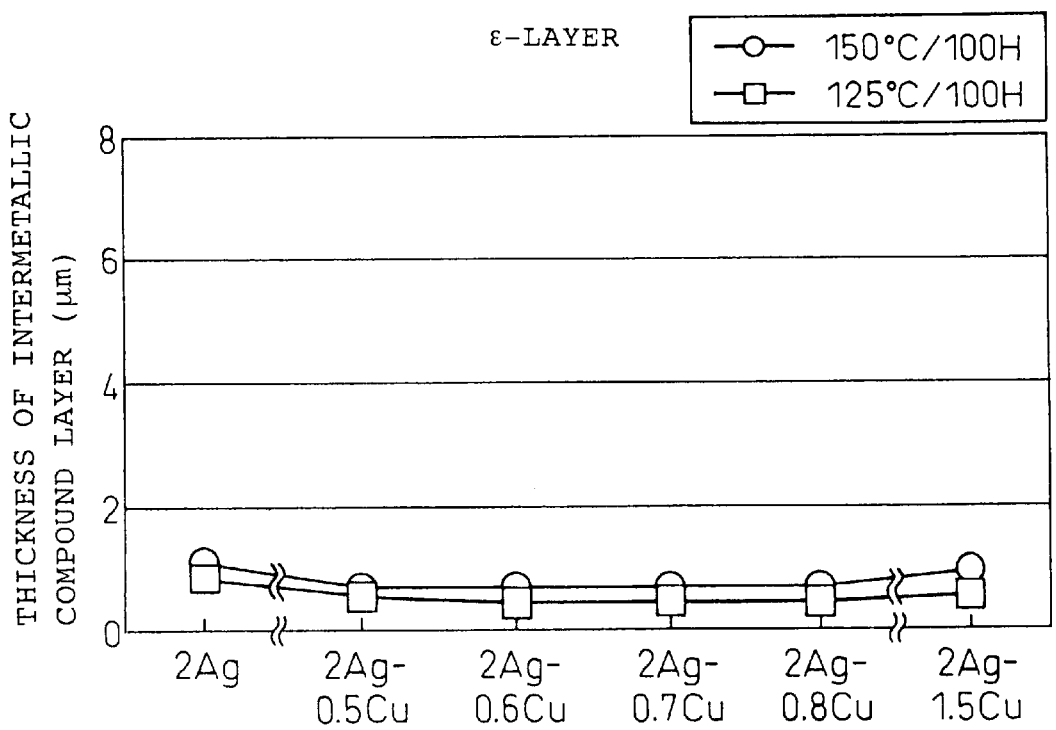
FIG. 6 is a graph showing, by the thickness of the ε-layer alone, the growth of the intermetallic compound layer in the case of heating a soldered joint formed by 2 wt % Ag-0 to 1.5 wt % Cu—Sn solder alloy at 125° C. and 150° C. for 100 hours.
Figure 7:
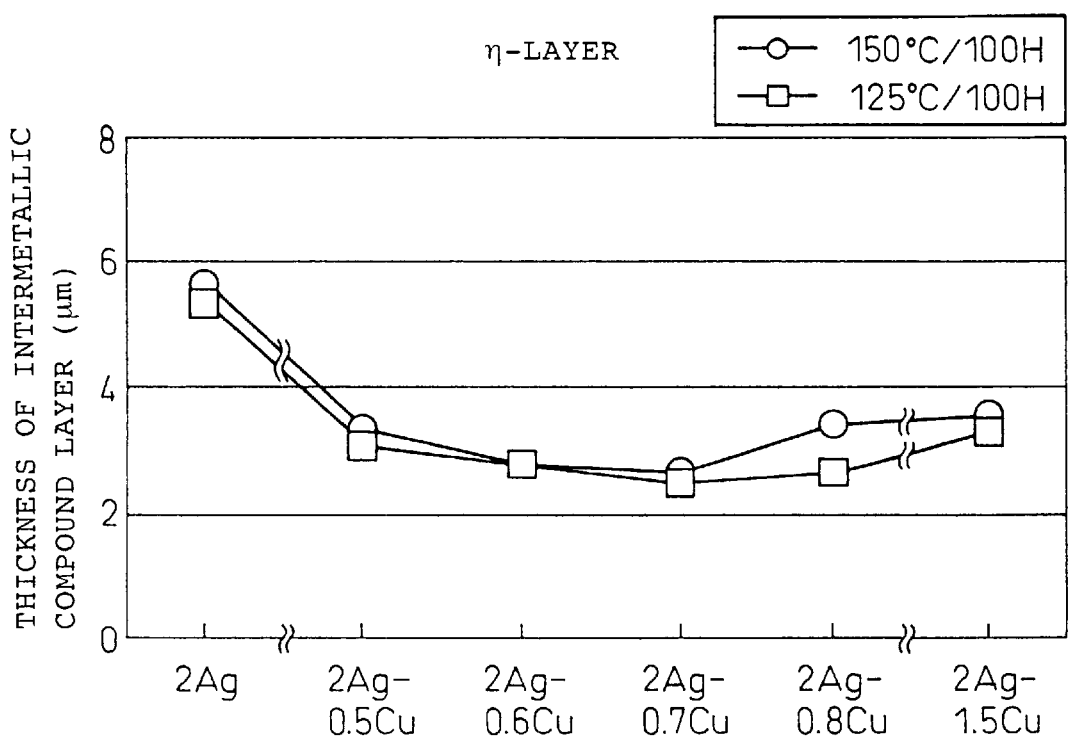
FIG. 7 is a graph showing, by the thickness of the ε-layer alone, the growth of the intermetallic compound layer in the case of heating a soldered joint formed by 2 wt % Ag-0 to 1.5 wt % Cu—Sn solder alloy at 125° C. and 150° C. for 100 hours.
Figure 8:
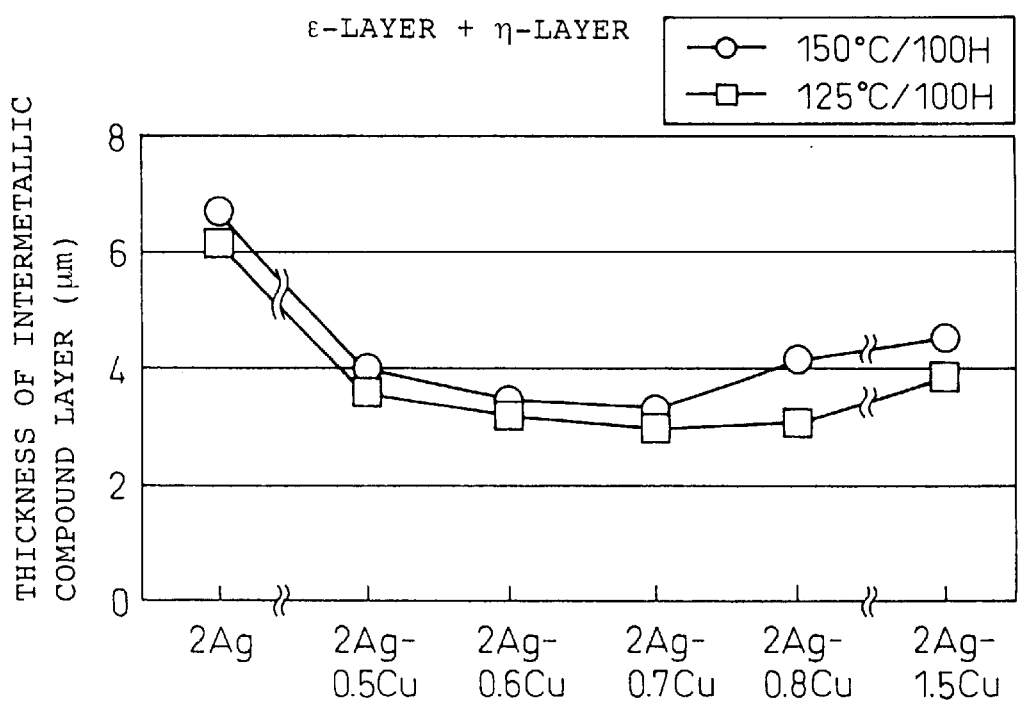
FIG. 8 is a graph showing, by the thickness of the ε-layer and the η-layer in total, the growth of the intermetallic compound layer in the case of heating a soldered joint formed by 2 wt % Ag-0 to 1.5 wt % Cu—Sn solder alloy at 125° C. and 150° C. for 100 hours.
Figure 9:
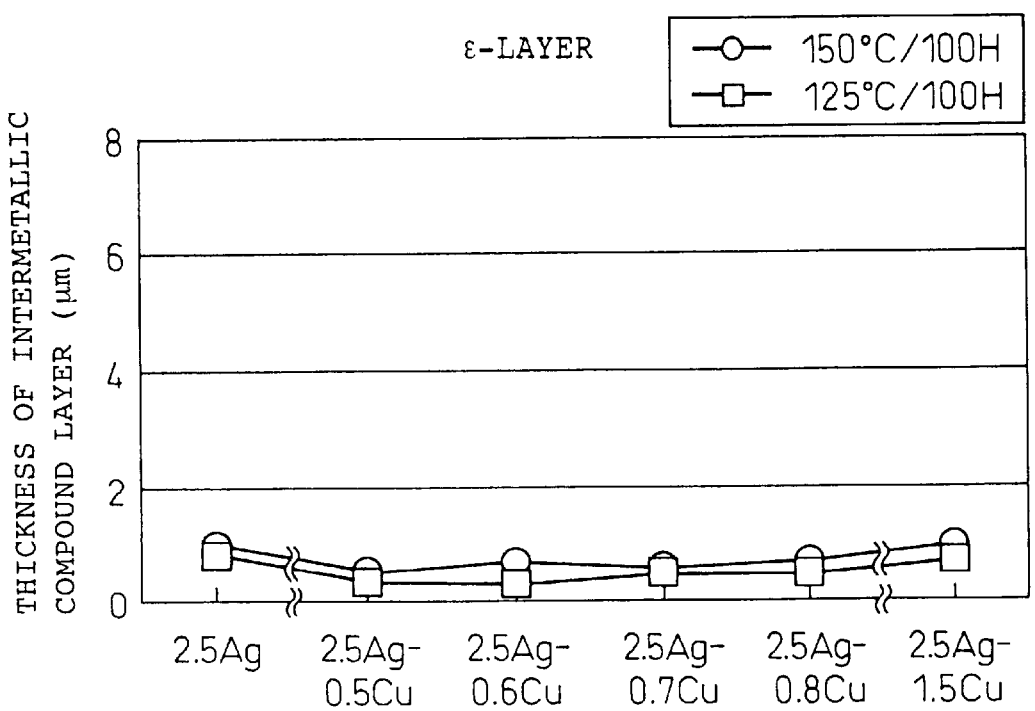
FIG. 9 is a graph showing, by the thickness of the ε-layer alone, the growth of the intermetallic compound layer in the case of heating a soldered joint formed by 2.5 wt % Ag-0 to 1.5 wt % Cu—Sn solder alloy at 125° C. and 150° C. for 100 hours.
Figure 10:
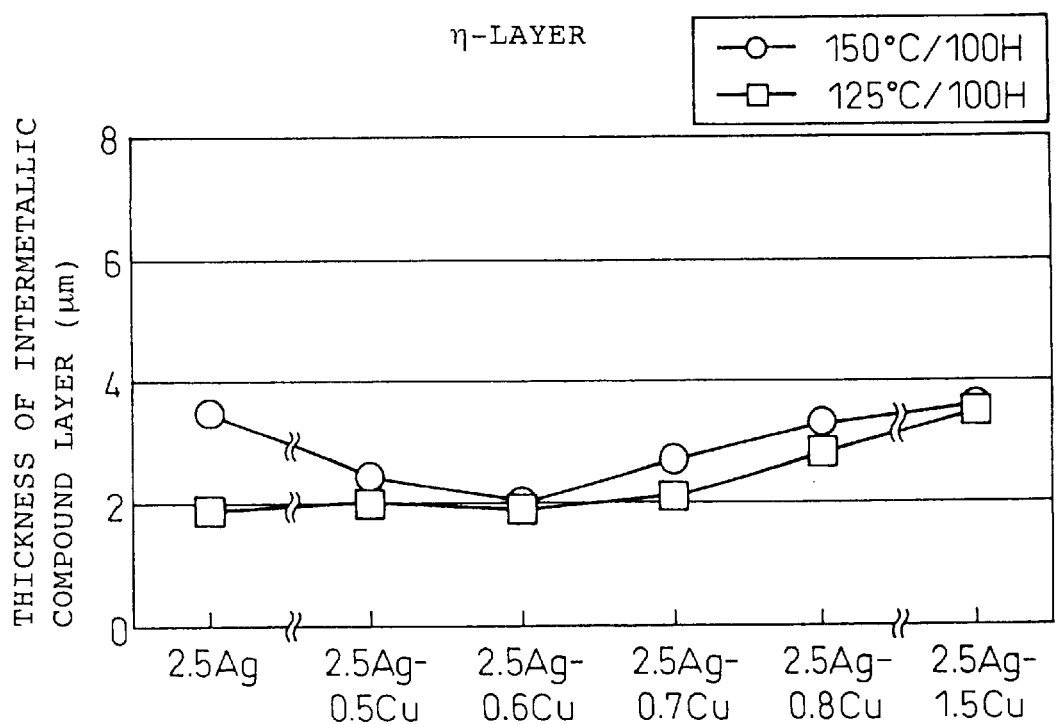
FIG. 10 is a graph showing, by the thickness of the η-layer alone, the growth of the intermetallic compound layer in the case of heating a soldered joint formed by 2.5 wt % Ag-0 to 1.5 wt % Cu—Sn solder alloy at 125° C. and 150° C. for 100 hours.
Figure 11:
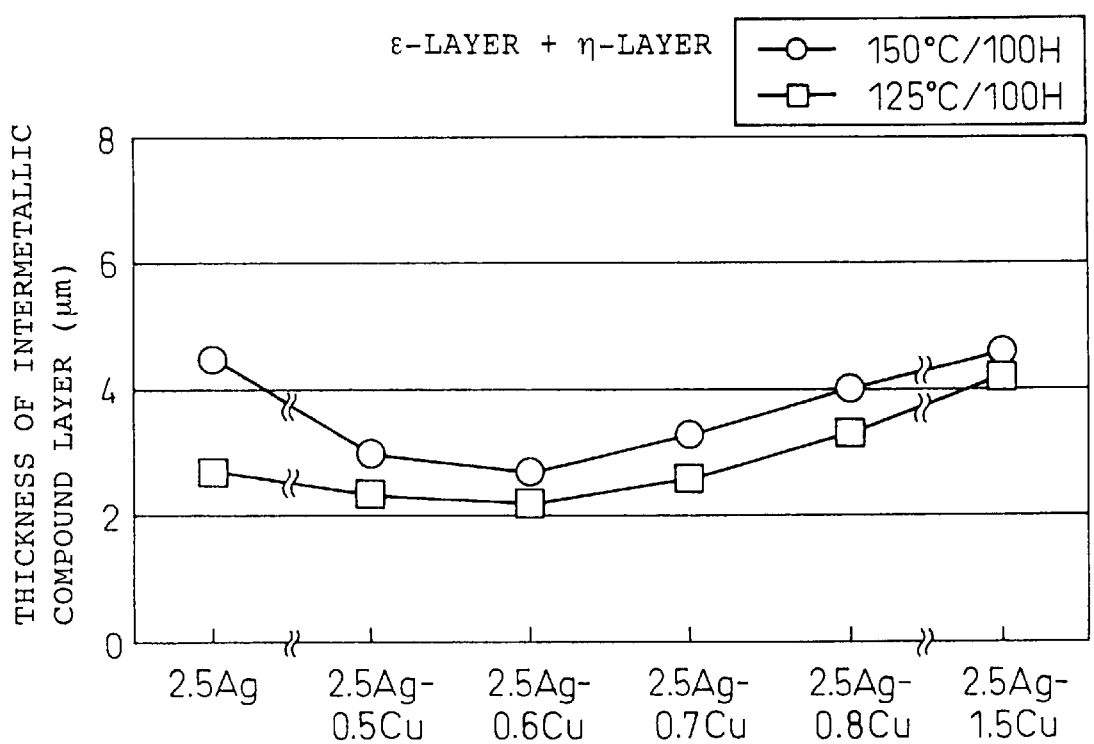
FIG. 11 is a graph showing, by the thickness of the ε-layer and the η-layer in total, the growth of the intermetallic compound layer in the case of heating a soldered joint formed by 2.5 wt % Ag-0 to 1.5 wt % Cu—Sn solder alloy at 125° C. and 150° C. for 100 hours.
Figure 12:
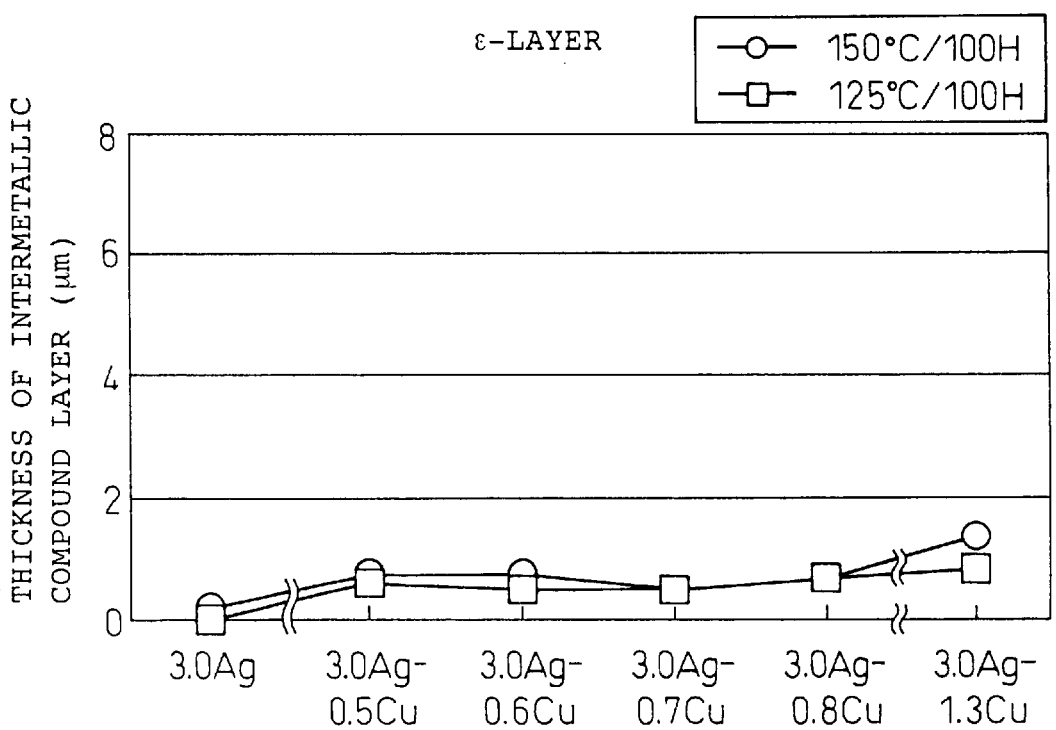
FIG. 12 is a graph showing, by the thickness of the η-layer alone, the growth of the intermetallic compound layer in the case of heating a soldered joint formed by 3 wt % Ag-0 to 1.5 wt % Cu—Sn solder alloy at 125° C. and 150° C. for 100 hours.
Figure 13:
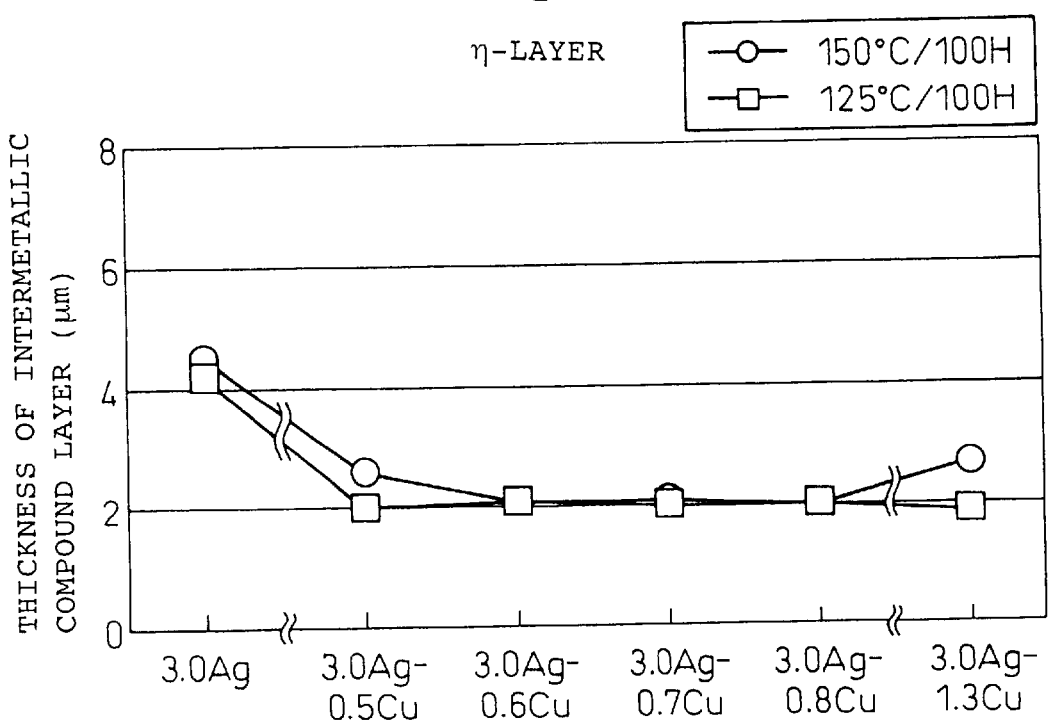
FIG. 13 is a graph showing, by the thickness of the η-layer alone, the growth of the intermetallic compound layer in the case of heating a soldered joint formed by 3 wt % Ag-0 to 1.5 wt % Cu—Sn solder alloy at 125° C. and 150° C. for 100 hours.
Figure 14:
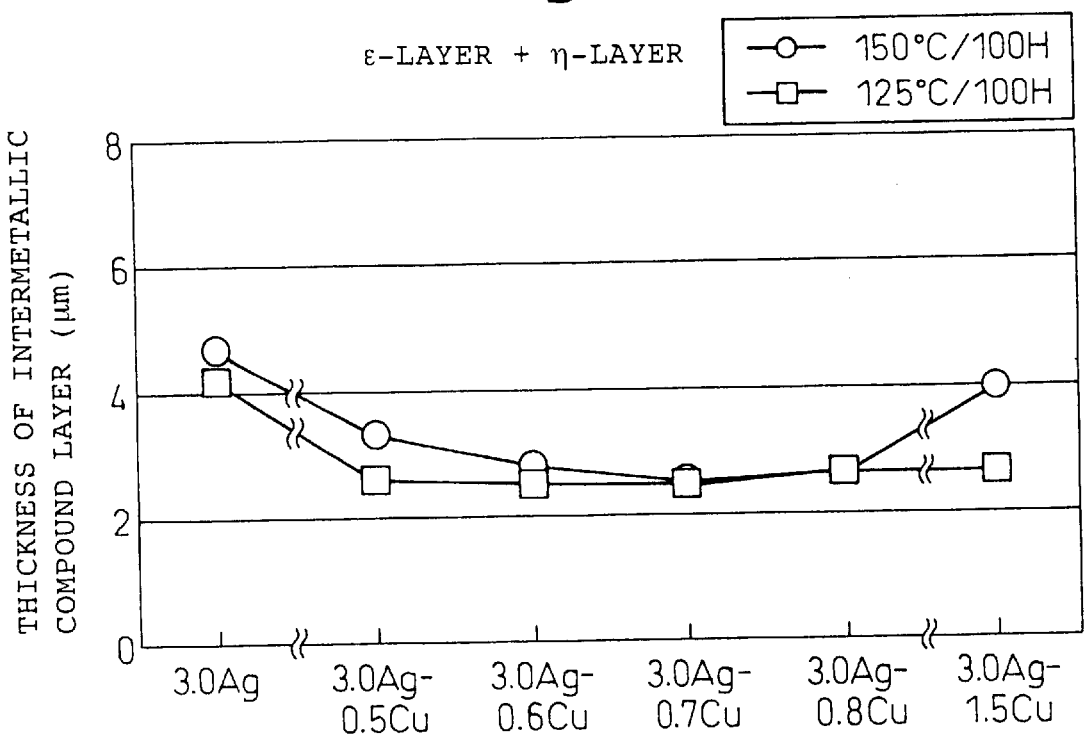
FIG. 14 is a graph showing, by the thickness of the ε-layer and the η-layer in total, the growth of the intermetallic compound layer in the case of heating a soldered joint formed by 3 wt % Ag-0 to 1.5 wt % Cu—Sn solder alloy at 125° C. and 150° C. for 100 hours.

The rust-proofing coating comprised of the organic compound containing N was decomposed by the heating, reacted with the acidic flux contained in the solder paste, and was removed from the Cu electrode/42 Alloy joint. That is, as shown in FIG. 5, the mixture 3 of the rust-proofing coating and flux is believed to have been expelled from the interface with the Cu electrode 1 by the melted solder alloy 2. Therefore, the rust-proofing coating covering the Cu electrodes never remains at the soldered interface.

After the rust-proofing coating was removed, the Sn in the molten solder alloy and the Cu in the electrodes reacted to produce two types of intermetallic compounds ($\epsilon$-phase: $Cu_3Sn$, $\eta$-phase: $Cu_6Sn_5$) at the solder alloy/Cu electrode interface. That is, the interface structure becomes Cu/$\epsilon$-layer/$\eta$-layer/solder alloy.

Due to the production of the intermetallic compounds, the solder alloy and the Cu electrodes are joined. That is, the production of the intermetallic compounds is essential for the joining. On the other hand, if too thick, the intermetallic compound layer becomes brittle and the strength of joint falls. Therefore, the intermetallic compound layer is preferably produced as thinly as possible at the time of joining. Preferably, it is resistant to growth due to the heat history after joining.

FIGS. 6 to 14 and Tables 5 to 7 show the growth of the intermetallic compound layer in the case of heating the soldered joints formed by the different solder alloys at 125° C. and 150° C. for 100 hours by the thickness of the $\epsilon$-layer alone, $\eta$-layer alone, and $\epsilon$-layer plus $\eta$-layer. In particular, as will be understood from FIG. 8, FIG. 11, and FIG. 14, the thickness of the intermetallic compound layer after the above heating (total thickness) is not more than about 4 $\mu$m when using a solder alloy of a composition within the range of the present invention. In particular, by making the Cu content 0.5 to 0.8 wt % of the range of the present invention, it is possible to stabilize and reduce the thickness of the intermetallic compound layer. Further, the thickness of the intermetallic compound layer tends to become smaller when the Ag content is in the range of at least 2.5 wt % rather than the range of not more than 2.5 wt % within the range of the present invention.

In this way, the soldered joint of the present invention is slow in growth of intermetallic compounds and ensures a higher reliability over the long term.

EXAMPLE 3

Figure 15:
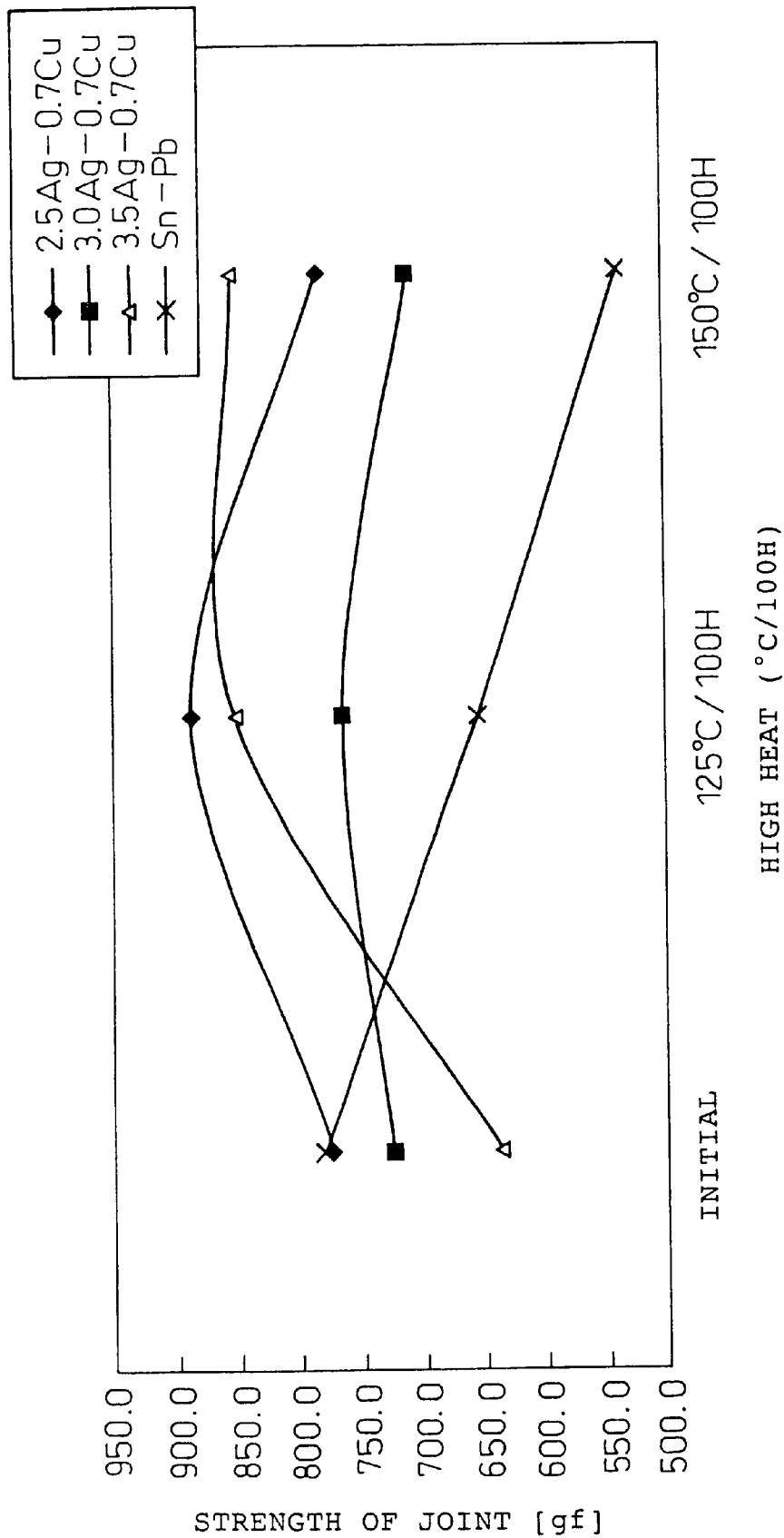
FIG. 15 is a graph showing, in comparison with a Pb—Sn solder alloy, the strength of joint per connection terminal of an electronic component before and after heating of a soldered joint formed by 2.5 to 3.5 wt % Ag-0.7 wt % Cu—Sn solder alloy.

The strength of joint after heat treatment was investigated. FIG. 15 shows the strength of joint in the state when bonded, after heating at 125° C. for 100 hours, and after heating at 150° C. for 100 hours for a 2.5 to 3.5 wt % Ag-0.7 wt % Cu—Sn solder alloy. From the results of the figure, it is learned that due to the present invention, a strength of joint equal to that of the conventional Pb—Sn solder alloy is obtained. In particular, the strength of joint due to a conventional Pb—Sn solder alloy falls monotonously due to heating (heat history), while the strength of joint according to the present invention is observed to tend to rather rise with heating.

TABLE 1

0 to 3.5Ag-0.7Cu-Sn

| Ag concentration (wt %) | Melting point (° C.) |
|---|---|
| 0.0 | 226.50 |
| 0.3 | 226.50 |
| 1.5 | 222.70 |
| 2.0 | 218.03 |
| 2.5 | 217.50 |
| 3.0 | 217.60 |
| 3.5 | 218.42 |
| Pb-Sn | 183.00 |

TABLE 2

3Ag-0 to 3Cu-Sn

| Cu concentration (wt %) | Melting point (° C.) |
|---|---|
| 0.0 | 221.63 |
| 0.1 | 220.63 |
| 0.2 | 218.47 |
| 0.3 | 218.10 |
| 0.4 | 218.17 |
| 0.5 | 218.80 |
| 0.6 | 218.17 |
| 0.7 | 217.60 |
| 0.8 | 217.73 |
| 1.3 | 217.45 |
| 1.5 | 217.83 |
| 3.0 | 218.67 |

TABLE 3

| Ag concentration (wt %) | Strength of joint (N) |
|---|---|
| Pb-Sn | 4.80 |
| 0.0 | 6.10 |
| 0.3 | 7.60 |
| 2.5 | 7.06 |
| 3.0 | 7.25 |
| 3.5 | 8.38 |

TABLE 4

| Cu concentration (wt %) | Strength of joint (N) |
|---|---|
| 0.5 | 8.04 |
| 0.6 | 8.29 |
| 0.7 | 7.08 |
| 0.8 | 8.43 |
| 1.3 | 7.29 |

TABLE 5

2Ag based — Unit: $\mu$m

| | $\epsilon$-layer | | $\eta$-layer | | $\epsilon$-layer + $\eta$-layer | |
|---|---|---|---|---|---|---|
| | 150° C./100H | 125° C./100H | 150° C./100H | 125° C./100H | 150° C./100H | 125° C./100H |
| Sn-2Ag | 1.07 | 0.80 | 5.60 | 5.33 | 6.67 | 6.13 |
| Sn-2Ag-0.5Cu | 0.67 | 0.53 | 3.33 | 3.07 | 4.00 | 3.60 |
| Sn-2Ag-0.6Cu | 0.67 | 0.40 | 2.80 | 2.80 | 3.47 | 3.20 |
| Sn-2Ag-0.7Cu | 0.67 | 0.46 | 2.67 | 2.50 | 3.34 | 2.96 |
| Sn-2Ag-0.8Cu | 0.67 | 0.40 | 3.47 | 2.67 | 4.13 | 3.07 |
| Sn-2Ag-1.5Cu | 0.93 | 0.53 | 3.60 | 3.33 | 4.53 | 3.87 |

TABLE 6

| 2.5Ag based | ε-layer | | η-layer | | ε-layer + η-layer | Unit: μm |
| --- | --- | --- | --- | --- | --- | --- |
| | 150° C./100H | 125° C./100H | 150° C./100H | 125° C./100H | 150° C./100H | 125° C./100H |
| Sn-2.5Ag | 1.00 | 0.80 | 3.50 | 1.90 | 4.50 | 2.70 |
| Sn-2.5Ag-0.5Cu | 0.53 | 0.33 | 2.46 | 2.00 | 2.99 | 2.33 |
| Sn-2.5Ag-0.6Cu | 0.70 | 0.30 | 2.00 | 1.90 | 2.70 | 2.20 |
| Sn-2.5Ag-0.7cu | 0.60 | 0.50 | 2.70 | 2.10 | 3.30 | 2.60 |
| Sn-2.5Ag-0.8Cu | 0.70 | 0.50 | 3.30 | 2.80 | 4.00 | 3.30 |
| Sn-2.5Ag-1.5Cu | 1.00 | 0.70 | 3.60 | 3.50 | 4.60 | 4.20 |

TABLE 7

| 3.0Ag based | ε-layer | | η-layer | | ε-layer + η-layer | Unit: μm |
| --- | --- | --- | --- | --- | --- | --- |
| | 150° C./100H | 125° C./100H | 150° C./100H | 125° C./100H | 150° C./100H | 125° C./100H |
| Sn-2Ag | 0.20 | 0.00 | 4.47 | 4.20 | 4.67 | 4.20 |
| Sn-3.0Ag-0.5cu | 0.73 | 0.60 | 2.60 | 2.00 | 3.33 | 2.60 |
| Sn-3.0Ag-0.6Cu | 0.73 | 0.47 | 2.07 | 2.07 | 2.80 | 2.53 |
| Sn-3.0Ag-0.7Cu | 0.47 | 0.47 | 2.07 | 2.00 | 2.53 | 2.47 |
| Sn-3.0Ag-0.8Cu | 0.67 | 0.67 | 2.00 | 2.00 | 2.67 | 2.67 |
| Sn-3.0Ag-1.3Cu | 1.33 | 0.80 | 2.67 | 1.87 | 4.00 | 2.67 |

Capability of Utilization in Industry

As explained above, according to the present invention, it is possible to secure an equivalent strength of joint to a conventional Pb—Sn solder alloy without causing environmental pollution by Pb and without causing a rise in cost.

What is claimed is:

1. A soldering method characterized by comprising the following steps of:

covering Cu electrodes of electronic equipment by a rust-proofing coating consisting of an organic compound including N, screen-printing on the covered Cu electrodes a solder paste consisting of a mixture of a flux and a solder powder consisting of at least 2.0 wt % and less than 3 wt % of Ag, 0.5 to 0.8 wt % of Cu, and a balance of Sn and unavoidable impurities, and forming soldered joints on the Cu electrodes by heating and cooling the screen-printed solder paste.

2. A soldering method as set forth in claim 1, characterized in that the solder material contains 2.0 to 2.5 wt % of Ag.

3. A soldering method as set forth in claim 1, characterized in that the solder material contains at least 2.5 wt % and less than 3.0 wt % of Ag.

4. A soldered joint formed by a soldering method as set forth in claim 3.

5. A soldering method as set forth in claim 1, characterized in that the solder material further contains not more than 3 wt % in total of at least one element selected from the group consisting of Sb, In, Au, Zn, Bi and Al.

6. A soldered joint formed by a soldering method as set forth in claim 5.

7. A soldering method as set forth in claim 2, characterized in that the solder material further contains not more than 3 wt % in total of at least one element selected from the group consisting of Sb, In, Au, Zn, Bi and Al.

8. A soldered joint formed by a soldering method as set forth in claim 7.

9. A soldered joint formed by a soldering method as set forth in claim 1.

* * * * *